United States Patent
Blanchard

(10) Patent No.: US 6,420,764 B1
(45) Date of Patent: *Jul. 16, 2002

(54) FIELD EFFECT TRANSITOR HAVING DIELECTRICALLY ISOLATED SOURCES AND DRAINS AND METHODS FOR MAKING SAME

(75) Inventor: Richard A. Blanchard, Los Altos, CA (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/959,339

(22) Filed: Oct. 28, 1997

Related U.S. Application Data

(60) Continuation-in-part of application No. 08/820,406, filed on Mar. 12, 1997, now Pat. No. 5,856,696, which is a division of application No. 08/397,654, filed on Feb. 28, 1995, now Pat. No. 5,668,025.

(51) Int. Cl.[7] .................... H01L 27/092; H01L 29/78; H01L 29/04
(52) U.S. Cl. ........................... 257/377; 257/51
(58) Field of Search .................. 257/51, 377

(56) References Cited

U.S. PATENT DOCUMENTS

| | | | |
|---|---|---|---|
| 4,041,518 A | 8/1977 | Shimizu et al. | 357/23 |
| 4,353,085 A | 10/1982 | Sakurai | 357/42 |
| 4,487,639 A | 12/1984 | Lam et al. | 148/175 |
| 4,523,213 A | 6/1985 | Konaka et al. | 357/23.7 |
| 4,609,407 A | 9/1986 | Masao et al. | 148/1.5 |
| 4,651,408 A | 3/1987 | MacElwee et al. | 29/576 J |

(List continued on next page.)

FOREIGN PATENT DOCUMENTS

| EP | 0 267 082 A1 | 5/1988 |
|---|---|---|
| JP | 56-115557 | 9/1981 |

OTHER PUBLICATIONS

Weitzel, Charles E. et al., "Silicon Carbide High–Power Devices", *IEEE Transactions on Electron Devices*, vol. 43, No. 10, pp. 1732–1741; Oct. 1996.

Primary Examiner—Gene M. Munson
(74) Attorney, Agent, or Firm—David V. Carlson; Lisa K. Jorgenson

(57) ABSTRACT

A field-effect transistor and a method for its fabrication is described. The transistor includes a monocrystalline semiconductor channel region overlying and epitaxially continuous with a body region of a semiconductor substrate. First and second semiconductor source/drain regions laterally adjoin opposite sides of the channel region and are electrically isolated from the body region by an underlying first dielectric layer. The source/drain regions include both polycrystalline and monocrystalline semiconductor material. A conductive gate electrode is formed over a second dielectric layer overlying the channel region. The transistor is formed by patterning the first dielectric layer to selectively cover a portion of the substrate and leave an exposed portion of the substrate. An additional semiconductor layer is then formed under conditions such that the monocrystalline semiconductor channel region forms on the exposed portion of the substrate and the part monocrystalline, part polycrystalline source/drain regions form on the first dielectric layer.

14 Claims, 3 Drawing Sheets

U.S. PATENT DOCUMENTS

| | | | |
|---|---|---|---|
| 4,763,183 A | 8/1988 | Ng et al. | 357/23.7 |
| 4,862,232 A | 8/1989 | Lee | 357/23.1 |
| 4,874,716 A | 10/1989 | Rao | 437/43 |
| 4,879,255 A | 11/1989 | Deguchi et al. | 431/59 |
| 4,914,053 A | 4/1990 | Matyi et al. | 437/90 |
| 4,916,508 A | 4/1990 | Tsukamoto et al. | 357/59 |
| 4,966,861 A | 10/1990 | Mieno et al. | 437/99 |
| 5,110,757 A | 5/1992 | Arst et al. | 437/89 |
| 5,132,755 A | 7/1992 | Ueno | 357/23.1 |
| 5,172,203 A | 12/1992 | Hayashi | 257/66 |
| 5,213,991 A | 5/1993 | Inokawa et al. | 437/41 |
| 5,338,697 A | 8/1994 | Aoki et al. | 437/40 |
| 5,347,151 A | 9/1994 | Shimizu et al. | 257/296 |
| 5,422,303 A | 6/1995 | Klose et al. | 437/89 |
| 5,498,567 A | 3/1996 | Klose et al. | 437/89 |
| 5,856,696 A * | 1/1999 | Blanchard | 257/377 |

* cited by examiner

FIELD EFFECT TRANSITOR HAVING DIELECTRICALLY ISOLATED SOURCES AND DRAINS AND METHODS FOR MAKING SAME

CROSS-REFERENCE TO RELATED APPLICATION

This application is a continuation-in-part of U.S. patent application Ser. No. 08/820,406, filed Mar. 12, 1997, which is a divisional of 08/397,654, filed Feb. 28, 1995 U.S. Pat. No. 5,668,025, issued Sep. 16, 1997, the specification of which is incorporated herein by reference.

TECHNICAL FIELD

This invention relates generally to integrated circuit devices and their fabrication, and more particularly, to integrated circuit transistors and methods for their fabrication.

BACKGROUND OF THE INVENTION

A number of potential problems are caused by the high circuit element density of today's integrated circuits. For example, densely packed field-effect transistors have relatively short channel lengths, resulting in increased potential for punchthrough effects. Also, the correspondingly shallow drain and source junction depths can result in junction spiking effects, in which metallization layers penetrate drain and source diffusions. The short channel lengths also result in higher electric field strengths, which in turn cause deleterious hot carrier effects. Reduced device geometries increase capacitive coupling between source/drain regions and the body of the transistor, resulting in degraded device performance and signal transmission characteristics. In the case of CMOS technology, parasitic thyristors and associated latchup effects arise. These and other fundamental problems must be addressed by the circuit designer and process engineer.

SUMMARY OF THE INVENTION

In accordance with an embodiment of the present invention, an integrated circuit formed on a monocrystalline semiconductor substrate is provided. The integrated circuit includes a monocrystalline first semiconductor region of a first conductivity type overlying the substrate. An electrical isolation region overlies the substrate and substantially laterally adjoins the first region. Second and third semiconductor regions of a second conductivity type overly the electrical isolation region and substantially laterally adjoin the first region. The first region may include an epitaxial region contiguous with the substrate. The electrical isolation region may include a dielectric layer overlying and contiguous with the substrate, with the second and third regions overlying and being contiguous with the dielectric layer. The second and third regions may include both substantially polycrystalline and substantially monocrystalline semiconductor material. The second and third regions and the first region may each consist essentially of the same semiconductor material, and the first region and the substrate may consist essentially of the same semiconductor material.

In accordance with another embodiment of the present invention, a field effect transistor is provided. The transistor includes a monocrystalline semiconductor body region and a monocrystalline semiconductor channel region overlying the body region. First and second semiconductor source/drain regions laterally adjoin opposite sides of the channel region and are electrically isolated from the body region. The first and second semiconductor source/drain regions may include substantially polycrystalline semiconductor regions and/or substantially monocrystalline semiconductor regions. The transistor may include a dielectric region underlying the source/drain regions to electrically isolate these regions from the body region. The transistor may further include a second dielectric region overlying the channel region, and a conductive gate region overlying the second dielectric region.

In accordance with an embodiment of the present invention, a method of fabricating an integrated circuit device on a monolithic semiconductor substrate is provided. The method includes forming a patterned dielectric layer on the substrate. The dielectric layer selectively covers some portions of the substrate and leaves an exposed portion of the substrate. A first, substantially monocrystalline semiconductor layer is then formed on the exposed portion of the substrate, and a second semiconductor layer is formed on the dielectric layer, with the first and second layers being substantially contiguous. The second semiconductor layer is doped to provide a conductivity type opposite that of the first semiconductor layer. Formation of the first semiconductor layer may include forming an epitaxial semiconductor layer on the exposed portion of the substrate, and may include the same semiconductor material as the substrate. Formation of the first and second semiconductor layers may be performed substantially simultaneously, and may be formed from essentially the same semiconductor material.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known features associated with integrated circuit transistors-as well as the processes for their fabrication-have not been shown or described in detail, to avoid unnecessarily obscuring the description of the embodiments of the invention.

Figure 1:
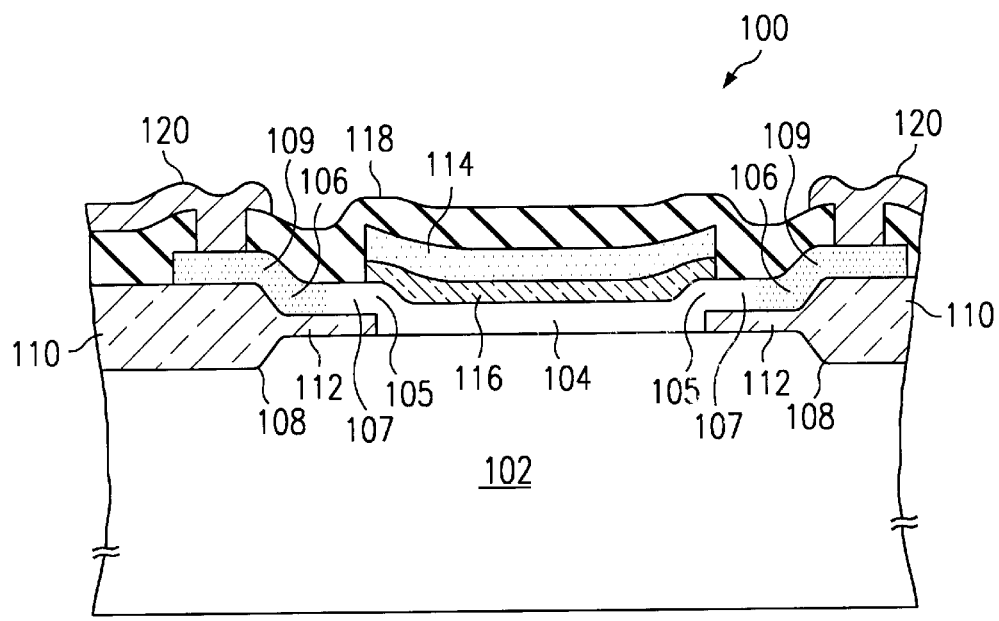
FIG. 1 is a cross-sectional view depicting a field-effect transistor in accordance with an embodiment of the present invention.

FIG. 1 depicts a transistor 100 in accordance with a first embodiment of the present invention. In this embodiment, the transistor 100 is a field-effect transistor formed on a semiconductor substrate 102. The substrate 102 is preferably a lightly doped monocrystalline silicon, but may be any of a variety of suitable semiconductor materials. The transistor 100 includes a monocrystalline semiconductor channel region 104, which is positioned between and adjacent to source/drain regions 106. The source/drain regions 106 overlie a dielectric region or layer 108, which substantially electrically isolates the source/drain regions from the substrate 102 or body region. For purposes of this description, and as will be clear to those skilled in the art, the term "channel region" shall mean that semiconductor region in which, for example, a conducting channel can be induced or depleted in an enhancement or depletion mode field-effect transistor, respectively. Further, the term "body region" shall mean that semiconductor region or portion of the substrate that is substantially contiguous with, underlying, and/or proximate to the channel region.

The channel region 104 itself may include regions 105 that partly overlap the dielectric layer 108. The source/drain regions 106 may include monocrystalline semiconductor regions 107 and/or polycrystalline semiconductor regions 109. The source/drain regions 106 and the channel region 104 are of relative conductivity types appropriate to the particular transistor type. In the case of an insulated gate enhancement mode field-effect transistor, for example, the source/drain regions 106 and the channel region 104 are of opposite conductivity types. The channel region 104 may be of the same or opposite conductivity type as the underlying substrate 102. In the latter case, and as dictated by particular desired device characteristics, electrical contacts (not shown) may be provided to the channel region 104 and to the substrate 102, or the transistor 100 can instead have a "floating body."

As depicted in FIG. 1, the dielectric layer 108 includes a first portion 110 having a first thickness and a second portion 112 having a second, lesser thickness. In one embodiment the first dielectric portion 110 may be a field isolation dielectric such as field oxide, whereas the second dielectric portion 112 may be of substantially the same construction as a gate dielectric layer. As shown in FIG. 1, the transistor 100 may be an insulated gate field-effect transistor, with a gate electrode 114 capacitively coupled by a gate dielectric 116 with the channel region 104. An interlevel dielectric 118 covers substantially all of the transistor 100, with electrical connections to the source/drain regions 106 provided by conductive electrodes such as patterned metal contacts 120.

In one embodiment, the gate electrode 114 partially laterally overlaps the second dielectric portion 112, corresponding to the regions 105 of the channel region 104 which partly overlap the second dielectric portion 112. Those skilled in the art will appreciate, however, that a number of alternative gate electrode geometries and configurations may be employed.

Figure 2:
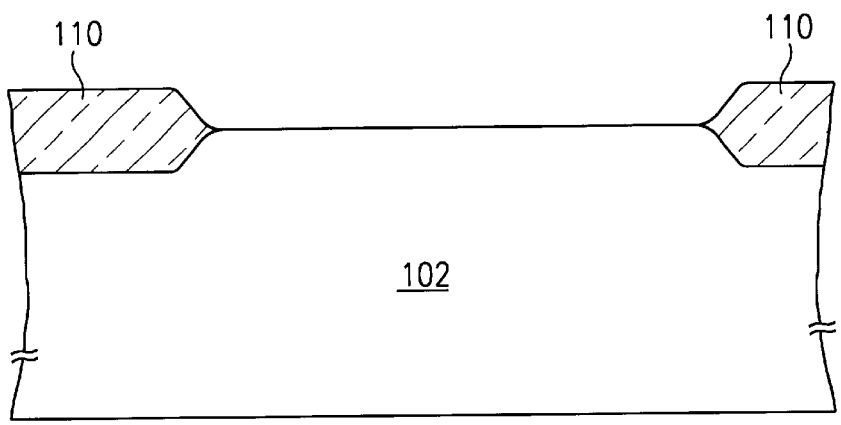
FIGS. 2–7 are cross-sectional views depicting selected steps during the fabrication of the transistor depicted in FIG. 1.
Figure 3:
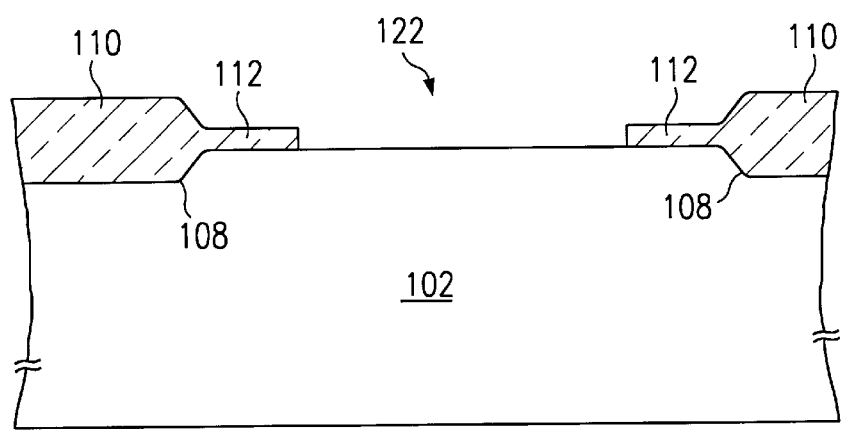

FIGS. 2–7 highlight certain process steps used for fabrication of the transistor 100 of FIG. 1. FIG. 2, for example, depicts the semiconductor substrate 102 with a patterned first dielectric portion 110 grown thereon. The first dielectric portion 110 may be a field oxide grown by LOCOS process and patterned using an oxide/nitride active stack, as is known in the art. Following growth of the first dielectric portion 110, the second dielectric portion 112 is grown and patterned, leaving an exposed surface portion 122 of the semiconductor substrate 102, as shown in FIG. 3. Formation and patterning of the second dielectric portion 112 may be accomplished by any of a variety of suitable techniques, particularly those techniques employed for fabrication of gate dielectric layers.

Figure 4:
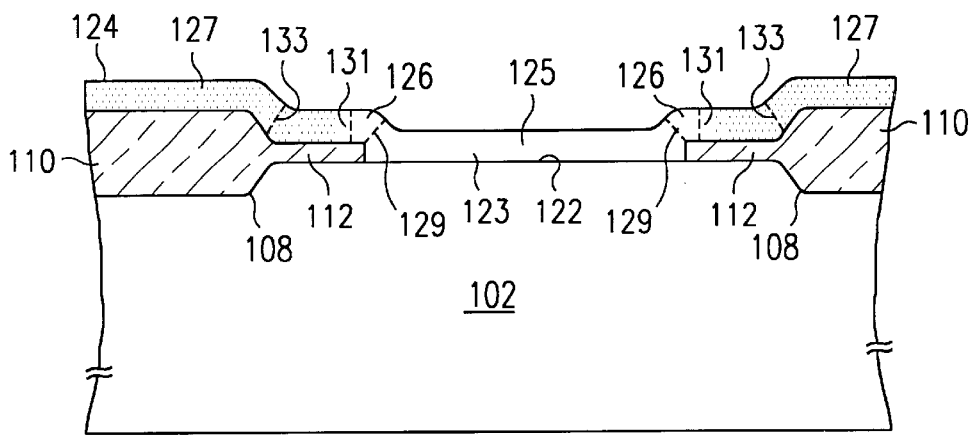

Additional semiconductor material 124 is then deposited, grown, or otherwise formed on the dielectric layer 108 and on the exposed surface portion 122 of the semiconductor substrate 102, as shown in FIG. 4. The additional material 124 is formed under such conditions as to promote selective epitaxial crystal growth in some regions and formation of polycrystalline structures in other regions. If the additional semiconductor material 124 is silicon, it is preferably formed at approximately 900° C. to a thickness of approximately 1000 Å, although a thickness in the range of 400–4000 Å and deposition temperature range of 800–1000° C. is acceptable.

The formation rate, time, temperature and other parameters associated with the formation of the additional semiconductor material 124 are selected to ensure that a portion 125 of the additional semiconductor material has the same monocrystalline structure as the substrate itself. These formation parameters are preferably controlled so the monocrystalline structure extends completely across the interface between the substrate 102 and additional semiconductor material 124 throughout a region 123 directly over and contiguous with the substrate. Further, this monocrystalline structure may extend laterally to provide a monocrystalline region 126 which is not in contact with the substrate 102 but which overlies the dielectric layer 108. Together, the monocrystalline region 123 overlying the substrate 102 and the monocrystalline region 126 abuttting and overlying the dielectric layer 108 form the portion 125 of the additional semiconductor material 124 having a monocrystalline structure. The additional semiconductor material 124 also includes a portion 127 that has a substantially polycrystalline structure.

The size and extent of the monocrystalline region 126 is controlled by selection and control of the formation parameters. In one embodiment, the formation parameters are controlled so that the monocrystalline region 126 extends only a short distance over the second dielectric portion 112 of the dielectric layer 108. In an alternative embodiment, the formation parameters are controlled so as to enlarge the size of the monocrystalline region 126 so it will extend over the entire second dielectric portion 112. As a further alternative, the monocrystalline portion 126 may even extend over the thicker first dielectric portion 110 of the dielectric layer 108, although this will normally not be preferred.

A transition region exists between the monocrystalline portion 125 and the polycrystalline portion 127 of the additional semiconductor material 124. In one embodiment, the transition region occurs approximately at line 129 shown in FIG. 4. In another embodiment, it is desirable to have the monocrystalline structure extend somewhat further over the second dielectric portion 112 of the dielectric layer 108 so that the transition region occurs approximately at line 131. In a further embodiment, the monocrystalline structure may extend to entirely cover the second dielectric portion 112, with the transistion region occurring approximately at line 133. In each of these embodiments, the occurrence of the transistion region will likely be symmetrical on both sides of the monocrystalline region 125, but need not be so.

The additional semiconductor material 124 can be any of a wide variety of suitable semiconductor materials, formed using any of wide variety of suitable methods. For example, and without limitation, the additional semiconductor material 124 may be silicon, a silicon containing compound semiconductor such as germanium-silicon alloy (of preferably less than 35% germanium) or silicon carbide, a non-silicon semiconducting layer such as germanium or diamond, or a non-silicon compound semiconductor such as gallium arsenide. The formation of the additional semiconductor material 124 may be accomplished by molecular beam epitaxy or other epitaxial deposition and growth techniques.

Silicon, germanium, silicon carbide, and silicon-germanium alloys have substantially similar crystal lattice spacing, and can be epitaxially formed on the surface portion 122 of the substrate 102 in any of a variety of manners known to those skilled in the art. If the additional semiconductor material 124 has a substantially different crystal structure from the underlying silicon substrate 102, the silicon substrate may then be cut to provide a crystal orientation other than the conventional 100 or 111 orientations to approximately match the lattice spacing associated with the additional semiconductor material. Thus, diamond, gallium arsenide, and other semiconductor materials may also be employed to form the various monocrystalline and polycrystalline regions/portions described above in connection with FIG. 4. The growth on a silicon substrate of epitaxial layers other than silicon is known in the art, and can be accomplished by known and future developed techniques suited to the particular additional semiconductor material chosen.

By providing for any of a wide variety of semiconductor materials to be used for the additional material 124, embodiments of the present invention allow fabrication of devices with a wide range of desirable circuit characteristics. For example, silicon carbide and diamond have properties such as high conduction band energy gaps, making them especially suitable for optoelectronic applications. Similarly, silicon carbide and diamond are especially useful in devices where high operating temperatures are expected. Also, silicon carbide and gallium arsenide, among others, are semiconductor materials especially suitable for applications where extremely high switching speeds are required.

Figure 5:
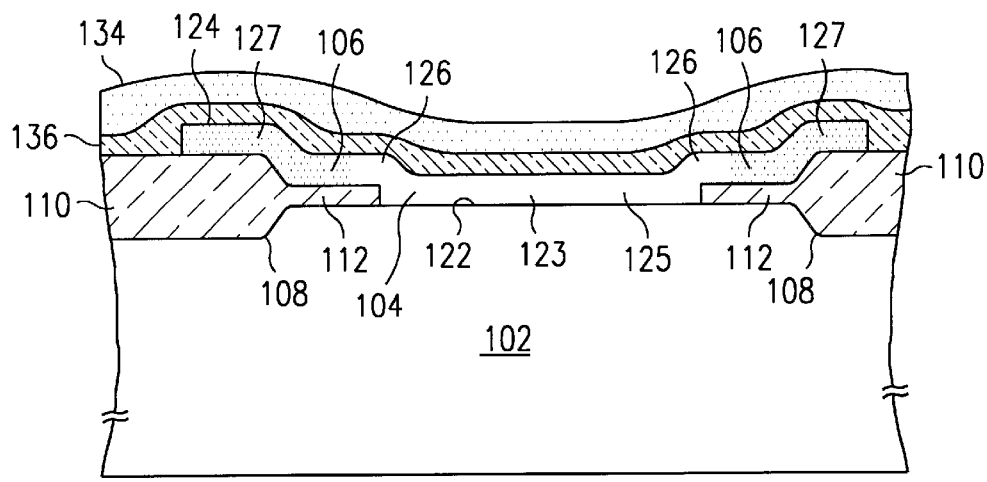
Figure 6:
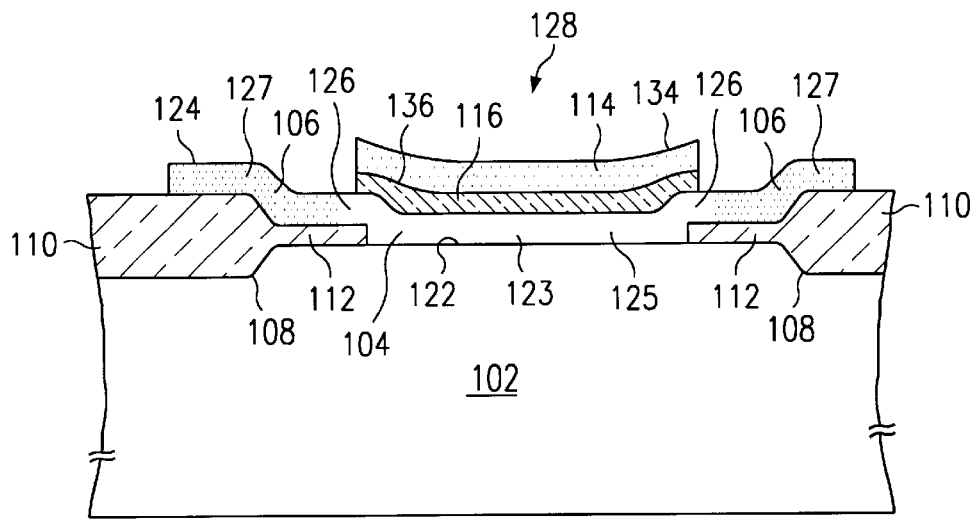

Preferably, the additional semiconductor material 124 is lightly doped, either during or soon after its formation, to provide threshold voltage adjustment for the channel region 104 (see FIG. 1). FIG. 5 shows the additional semiconductor material 124 having been etched or otherwise patterned to form the channel region 104 and source/drain regions 106. A gate dielectric layer 136 is deposited or otherwise formed on the patterned additional semiconductor material 124, and a gate electrode layer 134 is, in turn, deposited or otherwise formed thereon. The gate dielectric layer 136 and gate electrode layer 134 are then etched or otherwise patterned to form a gate structure 128 including the gate dielectric 116 and the gate electrode 114 described above in connection with FIG. 1, and as shown in FIG. 6.

The size and extent of the gate dielectric 116 and gate electrode 114 may be selected according to a variety of desired design parameters and device characteristics. The size and extent of the gate dielectric 116 and gate electrode 114 may also be selected according to the location of the transition region from the monocrystalline portion 125 to the polycrystalline portion 127 of the additional semiconductor material 124. In one embodiment, for example, the gate dielectric 116 and electrode 114 extend for a selected distance beyond the region 123 that directly overlies and is contiguous with the substrate 102, thereby assuring formation of the source/drain regions 106 exclusively overlying the dielectric layer 108.

The gate electrode may be substantially aligned with the transition region between the monocrystalline portion 125 and polycrystalline portions 127. In this case, the source/drain regions 106 are essentially formed in polycrystalline material only and the channel region 104 is in monocrystalline material, with polycrystalline source/drain regions laterally abutting and directly adjacent to a monocrystalline channel region. In a further embodiment, a portion or a majority of the source/drain regions 106 may be formed in monocrystalline material positioned over the second dielectric portion 112 of the dielectric layer 108. In some embodiments, a portion of the channel region 104 may itself be over the second dielectric portion 112, with that portion 123 directly overlying and contiguous with the substrate 102 then functioning as a body contact. In still other embodiments a smaller channel region may be desired, in which case the gate electrode 114 does not extend so far as to overlap the second dielectric portion 112.

If the selected additional semiconductor material 124 is silicon, the gate dielectric layer 136 is preferably a gate oxide grown over the channel region 104 to a thickness of approximately 100 Å, although thicknesses in the range of approximately of 50–500 Å are acceptable (and likely to decrease with future technology advances). The gate dielectric layer 136 may be any of a variety of materials corresponding to the particular chosen additional semiconductor material 124, as is well known in the art. For example, if the additional semiconductor material 124 is diamond or silicon carbide, the gate dielectric layer 136 may be a deposited layer of silicon-dioxide. If, for example, the additional semiconductor material 124 is gallium arsenide, the dielectric layer 136 may be a deposited layer of silicon-nitride. The gate electrode layer 134 is preferably a second polycrystalline silicon layer of approximately 3500 Å thickness, although thicknesses in the range of approximately 2500–7500 Å are acceptable (and may be correspondingly reduced if a salicide or silicide step is performed).

Figure 7:
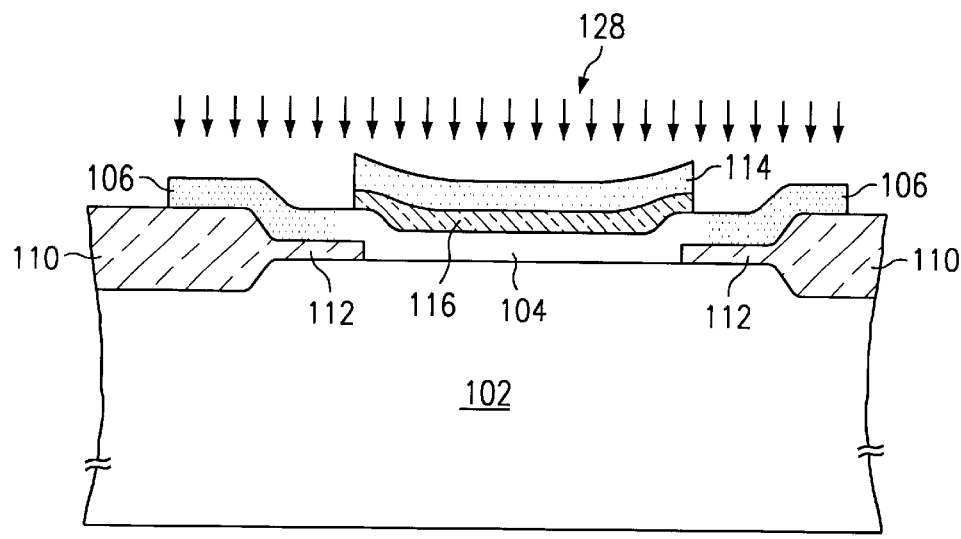

FIG. 7 depicts steps associated with the doping of the source/drain regions 106 and the gate electrode 114, such as by ion bombardment. If the selected additional semiconductor material 124 is silicon, suitable P-type and N-type dopants are applied as appropriate. Example dosages are $10^{16}$ cm$^{-2}$ of $BF_2^-$ at 30 keV ($2\times10^{15}$–$2\times10^{16}$ cm$^{-2}$ at 10 keV–50 keV is acceptable) and $5\times10^{15}$ cm$^{-2}$ of $As^+$ at 20 keV ($10^{15}$–$10^{16}$ cm$^{-2}$ at 10–50 keV is acceptable). Suitable dopant materials and dosage/energy distributions for additional semiconductor material 124 other than the preferred silicon will be apparent to those skilled in the art. For example, Group II and Group VI elements are used for doping gallium arsenide, and boron and nitrogen are used for doping diamond.

In the case of the insulated gate field-effect transistor shown in FIG. 1, the dopant supplied to the source/drain regions 106 provides an opposite conductivity type to that of the channel region 104, although the same conductivity type could be employed for other transistor structures such as JFETs. The dopant supplied to the gate electrode 114 may be of the same type as applied to the source/drain regions 106, or of the same conductivity type as the underlying substrate 102 and/or channel region 104, as is most advantageous for other circuit parameter requirements.

Figure 8:
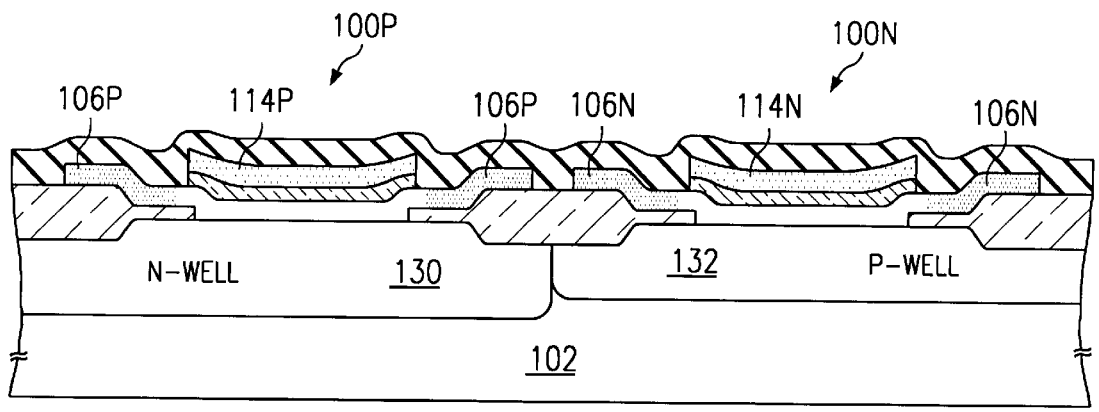
FIG. 8 is a cross-sectional view depicting a CMOS semiconductor device including two field effect transistors like that depicted in FIG. 1.

The transistor structure 100 described above in connection with FIG. 1, as well as the process steps for fabricating same as described in connection with FIGS. 2–7, can be readily adapted to CMOS applications, as shown in FIG. 8. In this case, a P-channel transistor 100P is formed over an N-well 130 formed in the semiconductor substrate 102, and an N-channel transistor 100N is formed in a P-well 132. The source/drain regions 106P are doped P-type, whereas the source/drain regions 106N are doped N-type. The material used to form the gate electrodes 114P and 114N may also be advantageously used to interconnect portions of the P-channel transistor 100P and the N-channel transistor 100N.

Figure 9:
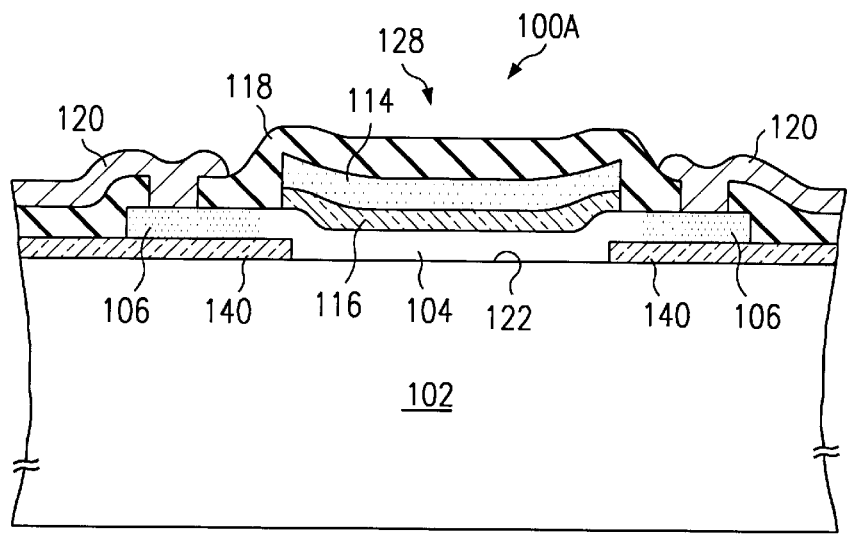
FIG. 9 is a cross-sectional view depicting a field-effect transistor according to another embodiment of the present invention.

The thick isolating field oxide 110 (see FIG. 1) may be unnecessary. FIG. 9 depicts an alternative embodiment transistor 100A, in which the source/drain regions 106 are formed entirely over a substantially uniform thickness dielectric region 140 having dimensions substantially like a gate dielectric layer. In this case, a self-aligned channel-stop implant is performed (with an energy selected to reach through the thickness of the dielectric region 140) after the gate structure 128 is in place. Selective oxidation of the polycrystalline material forming the source/drain regions 106 may also be performed to avoid potential parasitic transistors. The embodiment of FIG. 9 may provide important advantages of increased planarity and reduced process complexity, and may be particularly suited to applications where the combination of on-chip voltages, dielectric thickness, and substrate doping are such that parasitic transistors do not turn on.

The above-described structure of the transistor 100 and the process steps for its fabrication can be readily adapted to a wide variety of applications. In addition to CMOS (described above) other applications might include DMOS, JFET, and BiCMOS technologies. Such adaptations will be apparent to those skilled in the art, and are therefore not shown or described. Adaptations to CMOS applications may be particularly advantageous. Threshold voltage adjust implants are provided to the channel region 104, and the electrical function of the well regions 130, 132 (see FIG. 8) is less important than in current CMOS architectures. In accordance with described embodiments of the present invention, the electrical function of the CMOS well regions is substantially only to provide back biasing. Thus, the depth and doping of the wells is less critical than in conventional CMOS processes, and such parameters can be optimized for other applications—such as to optimize gain and breakdown characteristics of bipolar devices in BiCMOS or bipolar/CMOS/DMOS processes.

The device structure of the above-described embodiments could be used for one of the device types in a CMOS integrated circuit, such as PMOS devices, with NMOS devices then be constructed conventionally. Substantial removal of the just the PMOS devices from the substrate is sufficient to inhibit latchup effects, and the PMOS and NMOS devices could be partly overlapped to provide significant advantages in density. Still further advantages in density are provided by improved tolerance to contact misalignment. Conventional process design rules selected to avoid misaligned contacts to active areas and to polysilicon-over-active areas may be considerably relaxed in embodiments of the present invention.

Those skilled in the art will appreciate numerous advantages achieved in accordance with the above-described embodiments of the present invention. For example, problems associated with latchup are essentially negligible, since the source/drain regions 106 (and even portions of the channel region 104) of the transistor 100 are physically separated from the substrate 102 by the dielectric layer 108. Any potential latchup effects are reduced still further if the channel region 104 and substrate 102 are of opposite conductivity types. Also, prior art problems associated with junction spiking are avoided entirely since the source/drain regions 106 overlie the dielectric layer 108. In this case, any penetration of the metal 120 through the source/drain regions 106 is stopped by the dielectric material, and shorting to the substrate is entirely avoided. The relatively slower drift velocity of carriers in polycrystalline semiconductor material ameliorates hot carrier effects. The dielectric separation of the source/drain regions (and portions of the channel region 104) from the substrate significantly reduces capacitive coupling effects. Punchthrough is largely avoided, since significant depletion regions cannot form in the substrate. A further advantage provided is that lateral spacing between source/drain regions of adjacent transistors can be considerably reduced, since these regions are in polycrystalline semiconductor material, which can be conveniently laterally separated by etching. Circuit element density may also be increased due to the requirement that at most the channel region 104 need be photolithographically defined in the substrate 102, in contrast to conventional definition of active areas intended to include channel, source, and drain regions.

It will be appreciated that, although embodiments of the invention have been described above for purposes of illustration, various modifications may be made without deviating from the spirit and scope of the invention. For example, while the above-described embodiments relate to field-effect transistor structures, those skilled in the art will appreciate that bipolar and other types of transistors may be encompassed within the scope of the invention. Accordingly, the scope of the invention is not limited by the disclosure of the particular embodiments, and terms used in the following claims should not be construed to limit the invention to these embodiments. Instead, the scope of the invention is determined entirely by the following claims.

I claim:
1. A field-effect transistor, comprising:
   a first monocrystalline semiconductor region forming a first part of a body region;
   a second monocrystalline semiconductor region overlying the first part of the body region and forming a second part of the body region, said second part of the body region including a channel region and formed in a single deposited, integral silicon layer that also contains source and drain regions;
   a dielectric layer having a first uniform thickness adjacent the channel and a second uniform thickness at a location spaced from the channel region;
   first and second semiconductor source/drain regions in the same contiguous, integral silicon layer as the channel region and laterally adjoining opposite sides of the channel region and being electrically isolated from the underlying semiconductor region, each of the source/drain regions includes a substantially monocrystalline semiconductor region, the source and drain regions overlying both the first portion of the dielectric layer and the second portion of the dielectric layer;
   a second dielectric layer overlying said first and second semiconductor regions; and
   an electrically conductive layer extending through an opening in the second dielectric layer and in electrical contact with each of the source/drain regions.

2. A transistor according to claim 1, further comprising a conductive gate region proximate to the channel region.

3. A transistor according to claim 1, further comprising:
   a dielectric region overlying the channel region; and
   a conductive gate region overlying the dielectric region.

4. A transistor according to claim 1 wherein the channel region is epitaxially continuous with the body region.

5. A transistor according to claim 1 wherein each of the source/drain regions includes a substantially polycrystalline semiconductor region.

6. A transistor according to claim 1 wherein the body region includes silicon and the channel region includes one of silicon, silicon carbide, germanium, gallium arsenide, and diamond.

7. The transistor according to claim 1, wherein the electrically conductive layer is composed of metal.

8. A field-effect transistor, comprising:
a first monocrystalline semiconductor region forming a first part of a body region;
a second monocrystalline semiconductor region overlying the first part of the body region and forming a second part of the body region, said second part of the body region including a channel region and formed in a single deposited, integral silicon layer that also contains source and drain regions;
a first dielectric layer having a first thin portion of uniform thickness adjacent the channel and a second thick portion of uniform thickness at a location spaced from the channel region;
first and second semiconductor source/drain regions in the same contiguous, integral silicon layer as the channel region and laterally adjoining opposite sides of the channel region and being electrically isolated from the underlying semiconductor region, the source and drain regions overlying both the first portion of the dielectric layer and the second portion of the dielectric layer;
a second dielectric layer overlying said first and second semiconductor regions; and
an electrically conductive layer extending through an opening in the second dielectric layer and in electrical contact with each of the source/drain regions, said opening in the second dielectric layer occurring over the thick portion of the first dielectric layer so as to form a contact positioned entirely over the thick portion of the first dielectric layer.

9. A complementary metal oxide semiconductor (CMOS) integrated circuit structure comprising:
a substrate having a first conductivity type region forming a first region;
a second region in the substrate having a second conductivity type, opposite the conductivity type of the first region of the substrate;
a dielectric layer having portions extending over the first and second conductivity type regions of the substrate, respectively, the dielectric layer having openings at selected locations to expose the substrate in each of the respective first and second conductivity type regions;
a layer of deposited semiconductor material positioned in the openings having a portion in contact with the substrate and extending to overlap the dielectric layer;
the portions of the semiconductor layer in contact with the substrate being monocrystalline silicon and containing a body and channel region of a first conductivity type and a body and channel region of a second conductivity type;
the deposited layer including monocrystalline regions that extend over the dielectric layer;
the deposited semiconductor layer including portions doped with a second conductivity type adjacent to the body region of the first conductivity type so as to form source and drain regions over the dielectric layer;
the deposited semiconductor layer including portions doped with a first conductivity type adjacent to the body region of the second conductivity type so as to form source and drain regions over the dielectric layer;
portions of the semiconductor layer overlying the substrate of the second conductivity type being doped with the first conductivity type so as to form source and drain regions of the first conductivity type adjacent a channel region of the second conductivity type and over the dielectric layer;
a respective gate oxide formed over each of the first and second conductivity type substrate regions; and
a respective gate electrode formed over each of the gate oxides of the first and second conductivity type substrate regions.

10. The integrated circuit according to claim 9 wherein the dielectric layer includes a field oxide region positioned between the first conductivity type substrate region and the second conductivity type substrate region.

11. The integrated circuit according to claim 9 wherein the first region in the substrate is a P-well forming the first semiconductor region and the second region in the substrate is an N-well in the substrate forming the second semiconductor region of a conductivity type opposite the first semiconductor region.

12. The integrated circuit according to claim 9 further including a first, thin dielectric region and a second, thick dielectric region in the dielectric layer, the first and second dielectric regions being integral with the dielectric layer and being composed of the same material and the layer of semiconductor material extending over both the first and second regions of the dielectric layer.

13. A field-effect transistor, comprising:
a first monocrystalline semiconductor region forming a first part of a body region;
a second monocrystalline semiconductor region overlying the first part of the body region and forming a second part of the body region, said second part of the body region including a channel region and formed at least in part in a single deposited silicon layer that also contains source and drain regions, each of the source/drain regions including a substantially monocrystalline semiconductor region;
a dielectric layer having a first uniform thickness adjacent the channel and a second uniform thickness at a location spaced from the channel region;
first and second semiconductor source/drain regions in the same contiguous silicon layer as the channel region and laterally adjoining opposite sides of the channel region and being electrically isolated from the underlying semiconductor region, the source and drain regions overlying both the first portion of the dielectric layer and the second portion of the dielectric layer;
a second dielectric layer overlying said first and second semiconductor regions; and
an electrically conductive layer extending through an opening in the second dielectric layer and in electrical contact with each of the source/drain regions.

14. A field-effect transistor, comprising:
a first monocrystalline semiconductor region forming a first part of a body region;
a second monocrystalline semiconductor region overlying the first part of the body region and forming a second part of the body region, said second part of the body region including a channel region and formed at least in part in a single deposited silicon layer that also contains the source and drain regions;
a dielectric layer having a first uniform thickness adjacent the channel and a second uniform thickness at a location spaced from the channel region;
first and second semiconductor source/drain regions in the same contiguous silicon layer as the channel region and laterally adjoining opposite sides of the channel region and being electrically isolated from the underlying semiconductor region, the source and drain regions overlying both the first portion of the dielectric layer and the second portion of the dielectric layer;

a second dielectric layer overlying said first and second semiconductor regions;

an electrically conductive layer extending through an opening in the second dielectric layer and in electrical contact with each of the source/drain regions; and the second thickness of the dielectric layer is a thick portion, having a thickness greater than the first thickness of the dielectric layer and said opening in the second dielectric layer occurs over the portion of the first dielectric layer having the second thickness so as to form a contact position entirely over the region of the first dielectric layer having the second thickness.

* * * * *